(12) United States Patent
Mouli et al.

(10) Patent No.: US 7,510,897 B2
(45) Date of Patent: *Mar. 31, 2009

(54) PHOTODIODE WITH SELF-ALIGNED IMPLANTS FOR HIGH QUANTUM EFFICIENCY AND METHOD OF FORMATION

(75) Inventors: Chandra Mouli, Boise, ID (US); Howard Rhodes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/708,067

(22) Filed: Feb. 20, 2007

(65) Prior Publication Data

US 2007/0155040 A1    Jul. 5, 2007

Related U.S. Application Data

(60) Continuation of application No. 11/206,125, filed on Aug. 18, 2005, now Pat. No. 7,195,947, which is a division of application No. 10/655,219, filed on Sep. 5, 2003, now Pat. No. 6,969,631.

(60) Provisional application No. 60/478,348, filed on Jun. 16, 2003.

(51) Int. Cl.
*H01L 21/00* (2006.01)
(52) U.S. Cl. .......................................... 438/57; 438/48
(58) Field of Classification Search .................. 438/57, 438/60
See application file for complete search history.

(56) References Cited

U.S. PATENT DOCUMENTS

| 6,969,631 B2* | 11/2005 | Mouli et al. ................. 438/57 |
| 2004/0201072 A1* | 10/2004 | Rhodes ....................... 257/435 |
| 2005/0230721 A1 | 10/2005 | Patrick |

* cited by examiner

*Primary Examiner*—Long Pham
(74) *Attorney, Agent, or Firm*—Dickstein Shapiro LLP

(57) ABSTRACT

A pinned photodiode with a pinned surface layer formed by a self-aligned angled implant is disclosed. The angle of the implant may be tailored to provide an adequate offset between the pinned surface layer and an electrically active area of a transfer gate of the pixel sensor cell. The pinned surface layer is formed by employing the same mask level as the one employed for the formation of the photodiode region, and then implanting dopants at angles other than zero degrees.

20 Claims, 8 Drawing Sheets

PHOTODIODE WITH SELF-ALIGNED IMPLANTS FOR HIGH QUANTUM EFFICIENCY AND METHOD OF FORMATION

CROSS REFERENCE TO RELATED APPLICATIONS

The present application is a continuation of U.S. application Ser. No. 11/206,125, filed on Aug. 18, 2005 now U.S. Pat. No. 7,195,947, which in turn is a divisional of U.S. application Ser. No. 10/655,219, filed Sep. 5, 2003 (now U.S. Pat. No. 6,969,631, issued Nov. 29, 2005), which in turn claims priority of provisional application Ser. No. 60/478,348, filed Jun. 16, 2003, the disclosures of which are herewith incorporated by reference in their entirety.

FIELD OF THE INVENTION

The present invention relates to the field of semiconductor devices and, in particular, to improved photodiodes for high quantum efficiency.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

Because of the inherent limitations and expense of CCD technology, CMOS imagers have been increasingly used as low cost imaging devices. A CMOS imager circuit includes a focal plane array of pixel cells, each one of the cells including either a photodiode, a photogate or a photoconductor overlying a doped region of a substrate for accumulating photo-generated charge in the underlying portion of the substrate. A readout circuit is connected to each pixel cell and includes a charge transfer section formed on the substrate adjacent the photodiode, photogate or photoconductor having a sensing node, typically a floating diffusion node, connected to the gate of a source follower output transistor. The imager may include at least one transistor for transferring charge from the charge accumulation region of the substrate to the floating diffusion node and also has a transistor for resetting the diffusion node to a predetermined charge level prior to charge transference.

In a CMOS image sensor, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge from the floating diffusion node. Photo-generated charge may be amplified when it moves from the initial charge accumulation region to the floating diffusion node. The charge at the floating diffusion node is typically converted to a pixel output voltage by a source follower output transistor.

CMOS imaging circuits of the type discussed above are generally known and discussed in, for example, Nixon et al., "256.times.256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994), the disclosures of which are incorporated by reference herein.

A schematic top view of a semiconductor wafer fragment of an exemplary CMOS sensor pixel four-transistor (4T) cell 10 is illustrated in FIG. 1. As it will be described below, the CMOS sensor pixel cell 10 includes a photo-generated charge accumulating area 21 in an underlying portion of the substrate. This area 21 is formed as a pinned photodiode 11 (FIG. 2) formed as part of a p-n-p structure within a substrate 20. The pinned photodiode is termed "pinned" because the potential in the photodiode is pinned to a constant value when the photodiode is fully depleted. It should be understood, however, that the CMOS sensor pixel cell 10 may include a photogate or other image to charge converting device, in lieu of a pinned photodiode, as the initial accumulating area 21 for photo-generated charge.

The CMOS image sensor 10 of FIG. 1 has a transfer gate 30 for transferring photoelectric charges generated in the charge accumulating region 21 to a floating diffusion region (sensing node) 25. The floating diffusion region 25 is further connected to a gate 50 of a source follower transistor. The source follower transistor provides an output signal to a row select access transistor having gate 60 for selectively gating the output signal to terminal 32. A reset transistor having gate 40 resets the floating diffusion region 25 to a specified charge level before each charge transfer from the charge accumulating region 21.

A cross-sectional view of the exemplary CMOS image sensor 10 of FIG. 1 taken along line 2-2' is illustrated in FIG. 2. The charge accumulating region 21 is formed as a pinned photodiode 11 which has a photosensitive or p-n-p junction region formed by a p-type layer 24, an n-type region 26 and the p-type substrate 20. The pinned photodiode 11 includes two p-type regions 20, 24 so that the n-type photodiode region 26 is fully depleted at a pinning voltage. Impurity doped source/drain regions 22 (FIG. 1), preferably having n-type conductivity, are provided on either side of the transistor gates 40, 50, 60. The floating diffusion region 25 adjacent the transfer gate 30 is also preferable n-type.

FIG. 2 also illustrates trench isolation regions 15 formed in the active layer 20 adjacent the charge accumulating region 21. The trench isolation regions 15 are typically formed using a conventional STI process or by using a Local Oxidation of Silicon (LOCOS) process. A translucent or transparent insulating layer 55 formed over the CMOS image sensor 10 is also illustrated in FIG. 2. Conventional processing methods are used to form, for example, contacts 32 (FIG. 1) in the insulating layer 55 to provide an electrical connection to the source/drain regions 22, the floating diffusion region 25, and other wiring to connect to gates and other connections in the CMOS image sensor 10.

Generally, in CMOS image sensors such as the CMOS image sensor cell 10 of FIGS. 1-2, incident light causes electrons to collect in region 26. A maximum output signal, which is produced by the source follower transistor having gate 50, is proportional to the number of electrons to be extracted from the region 26. The maximum output signal increases with increased electron capacitance or acceptability of the region 26 to acquire electrons. The electron capacity of pinned photodiodes typically depends on the doping level of the image sensor and the dopants implanted into the active layer.

Minimizing dark current in the photodiode is important in CMOS image sensor fabrication. Dark current is generally attributed to leakage in the charge collection region 21 of the pinned photodiode 11 and is strongly dependent on the doping implantation conditions of the CMOS image sensor. High dopant concentrations in electrical connection region 23 (FIG. 2) typically increase dark current. In addition, defects and trap sites inside or near the photodiode depletion region strongly influence the magnitude of dark current generated. Dark current is a result of current generated from trap sites inside or near the photodiode depletion region; band-to-band tunneling induced carrier generation as a result of high fields in the depletion region; junction leakage coming from the lateral sidewall of the photodiode; and leakage from isolation corners, for example, stress induced and trap assisted tunneling.

A common problem associated with the pinned photodiode 11 of FIG. 2 is the generation of dark current as a result of gate-induced drain leakage (GIDL) in transfer gate overlap region 27 (FIG. 2). The transfer gate overlap region 27 is under gate 30 and permits an electrical connection between the n-type photodiode depletion region 26 and the diffusion node 25 when the transfer gate is turned on. As a result of the transfer gate overlap region 27 (FIG. 2), an undesirable barrier potential might exist in this region which further affects the full transfer of charge from the photodiode 11 when it is filly depleted.

To reduce this barrier potential, different masks can be used for the formation of the n-type photodiode region 26 and of the subsequently formed p-type pinned surface layer 24. For example, after the formation of the n-type photodiode depletion region 26 with a first mask, a second mask is employed so that high doses of low energy p-type dopant are implanted to form the p-type pinned surface layer 24. The second mask is preferably offset from the edge of transfer gate 30 to reduce the undesirable barrier potential. At the same time, however, the second mask must also have a good overlap in the field oxide region 15 for a better hookup of the p-type pinned surface layer 24 to sidewall 16 of the field oxide region 15 and region 23. Thus, the second mask is of critical importance to the formation of the pinned layer and the reduction of the gate-induced drain leakage (GIDL), which further affects dark current, in transfer gate overlap region 27. Mask misalignment may occur as a result of using several masks and this, in turn, affects the physical and electrical properties of the pinned layer.

CMOS imagers also typically suffer from poor signal to noise ratios and poor dynamic range as a result of the inability to fully collect and store the electric charge collected in the region 26. Since the size of the pixel electrical signal is very small due to the collection of electrons in the region 26 produced by photons, the signal to noise ratio and dynamic range of the pixel should be as high as possible.

There is needed, therefore, an improved active pixel photosensor for use in a CMOS imager that exhibits reduced dark current and an offset region within the transfer gate overlap region of the pixel sensor cell formed without incurring problems of mask misalignment which might affect pixel performance. A method of fabricating an active pixel photosensor exhibiting these improvements is also needed.

BRIEF SUMMARY OF THE INVENTION

In one aspect, the invention provides a pinned photodiode with a pinned layer formed by a self-aligned angled implant. The pinned layer is laterally displaced from an electrically active area of a transfer gate of a pixel sensor cell by a predetermined distance. The angle of the implant may be tailored to provide the adequate offset or the predetermined distance between the pinned surface layer and the electrically active area of the transfer gate of the pixel sensor cell.

In another aspect, the invention provides a method of forming a pinned surface layer of a pinned photodiode by employing the same mask level as the one employed for the formation of the photodiode region, and implanting desired dopants at angles other than zero degrees.

These and other features and advantages of the invention will be more apparent from the following detailed description that is provided in connection with the accompanying drawings and illustrated exemplary embodiments of the invention.

DETAILED DESCRIPTION OF THE INVENTION

Figure 1:
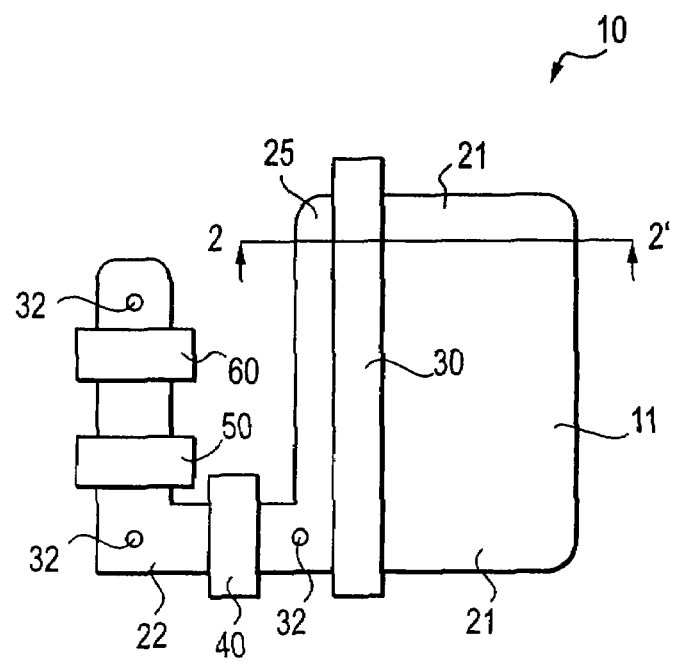
FIG. 1 is a top plan view of an exemplary CMOS image sensor pixel.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Referring now to the drawings, where like elements are designated by like reference numerals, FIGS. 3-13 illustrate exemplary embodiments of pixel sensor cells 100, 200, 300 (FIGS. 8, 10, 13) having respective pinned photodiodes 199, 299, 399 (FIGS. 8, 10, 13) with pinned surface layer 188, 188a (FIGS. 8, 10, 13) formed by either a straight or an angled implant.

Figure 2:
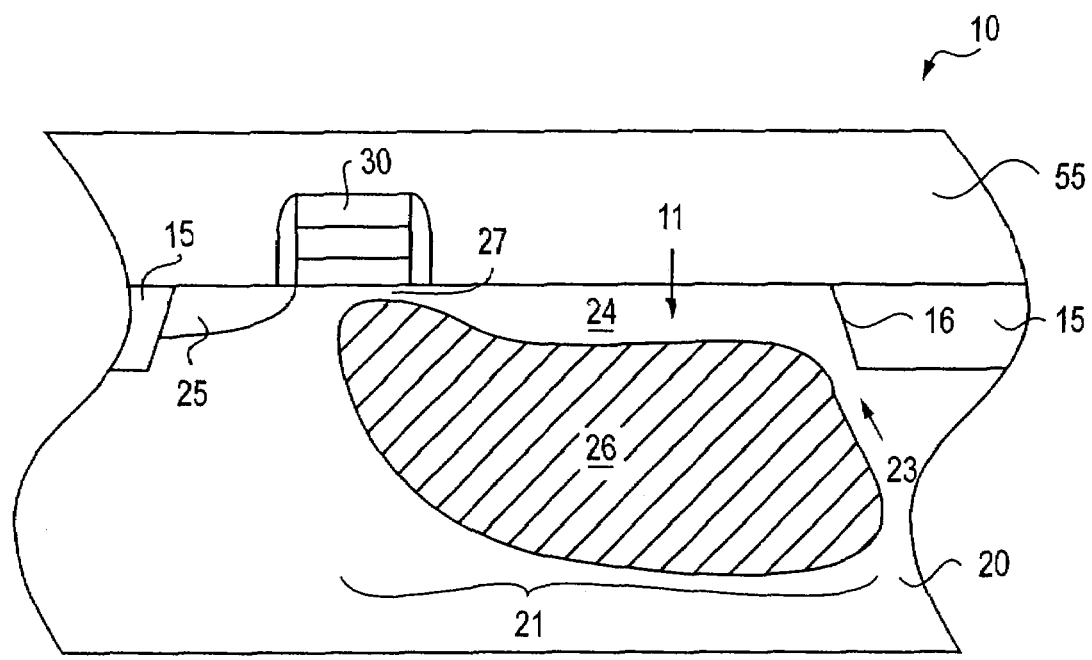
FIG. 2 is a schematic cross-sectional view of the CMOS image sensor of FIG. 1 taken along line 2-2'.
Figure 3:
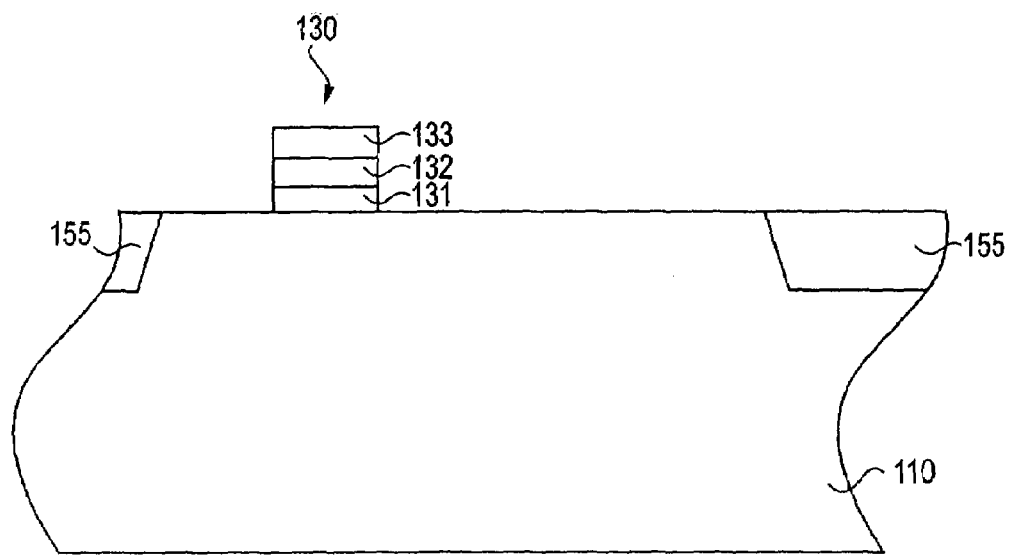
FIG. 3 is a schematic cross-sectional view of a CMOS image sensor pixel illustrating the fabrication of a pinned photodiode in accordance with the present invention and at an initial stage of processing.

FIG. 3 illustrates a substrate base 110 of a first conductivity type, which for exemplary embodiments is a p-type, along a cross-sectional view which is the same view as in FIG. 2. The substrate base 110 may be provided with the wafer. Instead of a substrate base 110 of the first conductivity type, a base layer of a first conductivity type that is implanted beneath the photodiode 199, 299, 399 by conventional methods before or after the formation of photodiode may be employed. For simplicity, the substrate base 110 is provided with the wafer and is described prior to the formation of the photodiode 199, 299, 399. Preferably, the substrate base 110 is a p-type epi substrate base 110 having an active buried p+ concentration within the range of about $1\times10^{17}$ to $1\times10^{19}$ atoms per $cm^3$, more preferably within the range of about $5\times10^{18}$ atoms per $cm^3$.

A field oxide region 155 (FIG. 3), which serves to surround and isolate the later formed pixel sensor cells 100, 200, 300 may be formed by etching trenches in the silicon substrate 110 and then filling the trenches with oxide (STI), or by chemical vapor deposition of an oxide material, or by other known technique including a LOCOS process.

FIG. 3 also illustrates a multi-layered transfer gate stack 130 formed over the silicon substrate 110. Preferably, the multi-layered transfer gate stack 130 has a height of about 400 Angstroms to about 4,000 Angstroms. The transfer gate stack 130 comprises a first gate oxide layer 131 of grown or deposited silicon oxide on the silicon substrate 110, a conductive layer 132 of doped polysilicon or other suitable material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

If desired, a silicide layer (not shown) may be also formed in the multi-layered gate stacks 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or $WN_x$/W or it could be entirely formed of $WN_x$.

Figure 4:
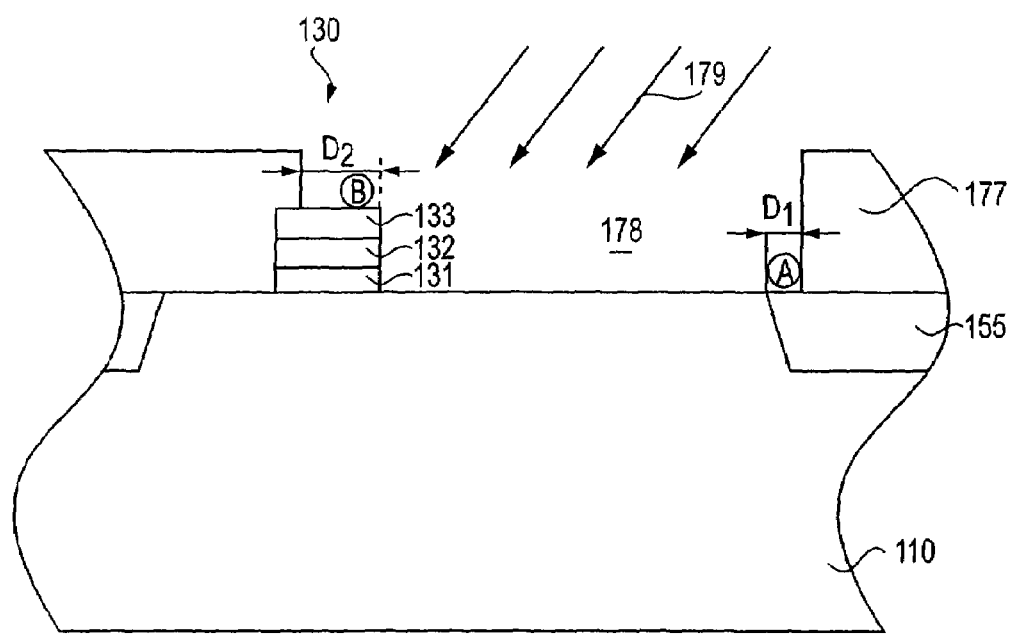
FIG. 4 is a schematic cross-sectional view of a CMOS image sensor fragment of FIG. 3 at a stage of processing subsequent to that shown in FIG. 3.

A photoresist layer 177 (FIG. 4) is next formed over the substrate to a thickness of about 1,000 Angstroms to about 10,000 Angstroms and patterned to obtain an opening 178 (FIG. 4) over the substrate between the transfer gate 130 and the field oxide region 155 where a charge accumulation region is to be formed. As illustrated in FIG. 4, the photoresist layer 177 is patterned so that opening 178 overlaps a part of the transfer gate 130 and the field oxide region 155. Thus, the photoresist layer 177 does not overlap the field oxide region 155 over a first offset region A (FIG. 4) characterized by first offset distance $D_1$. The photoresist layer 177 is also patterned to overlap only over a part of the gate stack 130, and not over second offset region B (FIG. 4) measured from the right side of the gate stack of gate 130 and characterized by a second offset distance $D_2$ (FIG. 4).

Figure 5:
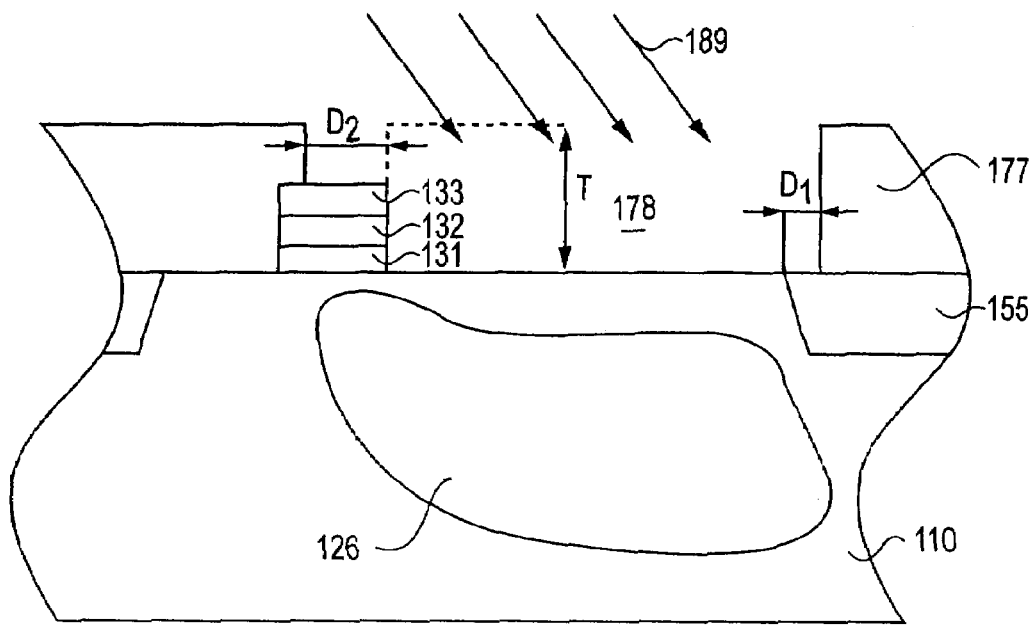
FIG. 5 is a schematic cross-sectional view of a CMOS image sensor pixel of FIG. 3 at a stage of processing subsequent to that shown in FIG. 4.

A first dopant implantation 179 (FIG. 4) using a dopant of a second conductivity type, which for exemplary purposes is n-type, is conducted to implant ions through the opening 178 (FIG. 4) in the area of the substrate directly beneath the active area of the pixel cell and to form an n-type buried region 126, as illustrated in FIG. 5. The implanted n-doped buried region 126 forms a photosensitive charge storage region for collecting photogenerated electrons. Ion implantation may be conducted by placing the substrate 110 in an ion implanter, and implanting appropriate n-type dopant ions through the opening 178 (FIG. 4) into the substrate 110 at an energy of 20 keV to 500 keV to form n-doped buried region 126. N-type dopants such as arsenic, antimony, or phosphorous may be employed. The dopant concentration in the n-doped region 126 (FIG. 5) is within the range of about $1\times10^{16}$ to about $5\times10^{17}$ atoms per $cm^3$, and is preferably within the range of about $3\times10^{16}$ to about $1\times10^{17}$ atoms per $cm^3$. If desired, multiple implants may be also used to tailor the profile of the n-doped region 126. These implants can be advantageously angled as shown in FIG. 4, towards the transfer gate.

Figure 8:
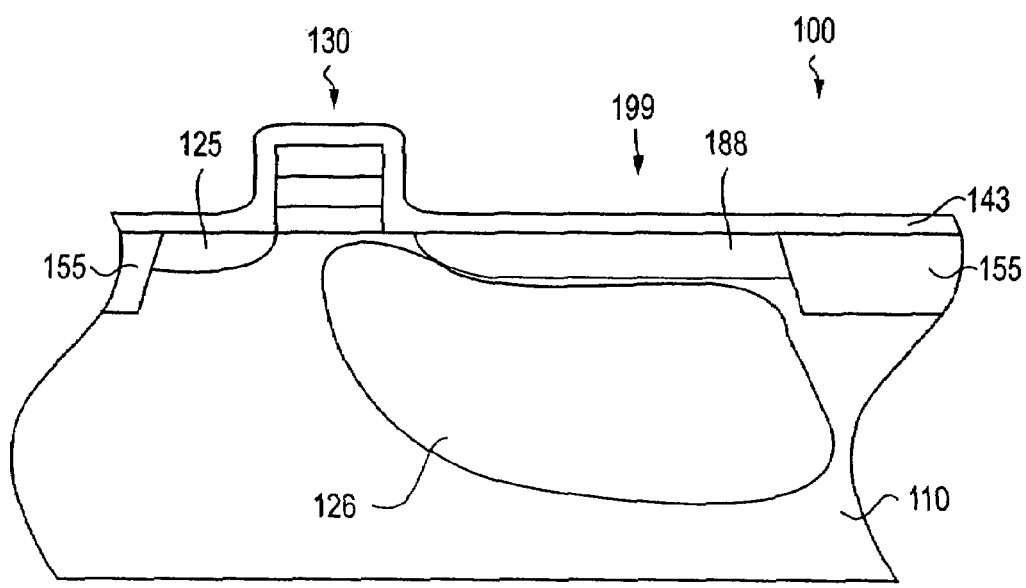
FIG. 8 is a schematic cross-sectional view of a CMOS image sensor pixel of FIG. 3 at a stage of processing subsequent to that shown in FIG. 6.

Next, the structure of FIG. 5 is subjected to a second dopant implantation 189 (FIG. 5). The second dopant implantation is an angled implantation with a dopant of the first conductivity type, which for exemplary purposes is p-type. This way, p-type ions are implanted through the second opening 178 (FIG. 5) into an area of the substrate over the implanted n-type region 126 and between the transfer gate 130 and field oxide region 155, to form a p-type pinned surface layer 188 of the now completed photodiode 199 formed by regions 188, 110 and 126, as illustrated in FIG. 8. Thus, region 188 is spaced away from the portion of region 126 which is below gate 130.

For the purposes of the present invention, the term "angled implantation" is defined as implantation conducted at incidence angles with the substrate 110 other than 0 degree angles, where 0 degrees is perpendicular to the substrate 110. Thus, the term "angled implantation" refers to implantation conducted at incidence angles with the substrate greater than 0 degrees to less than 90 degrees.

It must be noted that an advantage of the method of the present invention is the fact that the formation of the p-type pinned layer 188 does not require another photoresist layer and mask level to form region 188. Instead, the formation of the p-type pinned layer 188 employs the photoresist layer 177 used previously for the formation of the n-doped region 126. This is possible because the photoresist layer 177 was patterned to allow overlap over the field oxide region 155 and the transfer gate 130, except at the two offset regions A and B. By eliminating a mask level, the invention provides a method of forming a p-n-p photodiode with a reduced number of processing steps.

Figure 6:
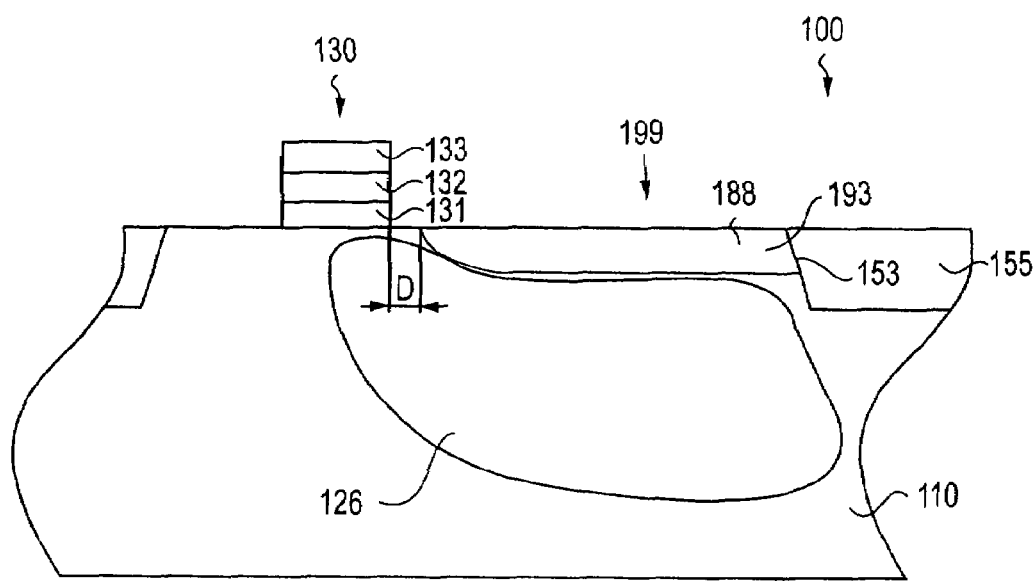
FIG. 6 is a schematic cross-sectional view of a CMOS image sensor pixel of FIG. 3 at a stage of processing subsequent to that shown in FIG. 5.

Referring back to FIG. 5, surface photodiode implant 189 is conducted to implant p-type ions, such as boron or indium, through the opening 178 and to form the p-type pinned surface layer 188 (FIG. 6). The p-type pinned surface layer 188 is self-aligned to the edge of the transfer gate 130 and the edge of the field oxide region 155 and displaced lateral to the transfer gate 130 by an offset distance D (FIG. 6). The angle of the surface photodiode implant 189 may be tailored to achieve the desired offset D (FIG. 6) between the edge of the gate stack 130 and the adjacent edge of the p-type pinned surface layer 188. The offset distance D (FIG. 6) may be about 100 to about 2,500 Angstroms, more preferably of about 200 to about 1,000 Angstroms. Preferably, the angle of the surface photodiode implant 189 may be of about 3 degrees to about 40 degrees.

Figure 7:
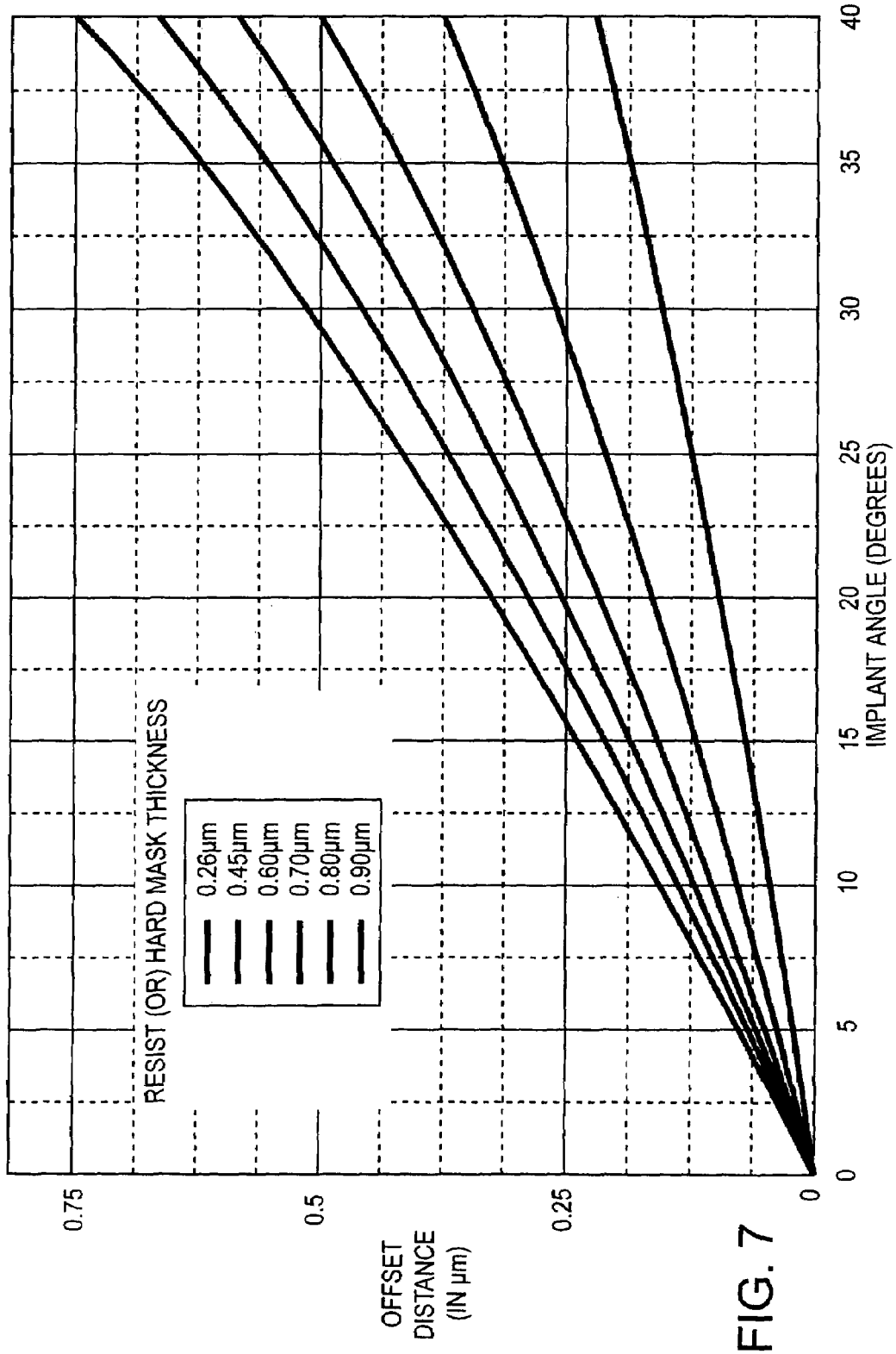
FIG. 7 illustrates the dependency of the offset distance function of the angle of the implant.

The angle of the surface photodiode implant 189 is function of the offset distance $D_2$ (FIG. 5) as well as a function of thickness T (FIG. 5) of the photoresist layer 177 and of the height of the gate stack. Accordingly, the offset distance may be tightly controlled by the implant angle. FIG. 7 illustrates, for one particular case, the dependency of the offset distance D as function of the implant angles. As depicted in FIG. 7, it is possible for example, to create a 0.10 μm (1,000 Angstroms) offset with a 21 degree angled implant and a stack height of about 0.26 μm (2,600 Angstroms). The dopant concentration in the p-type pinned surface layer 188 is within the range of about $1 \times 10^{17}$ to about $1 \times 10^{19}$ atoms per $cm^3$, and is preferably of about $5 \times 10^{17}$ to about $5 \times 10^{18}$ atoms per $cm^3$. If desired, multiple implants may be used to tailor the profile of the p-type pinned surface layer 188. In FIG. 7, the photoresist is pulled back from the edge of the transfer gate by distance $D_2$, so that the implant is self-aligned to the gate stack edge. In other cases, it is possible to have the implant self-aligned to the resist edge.

As a result of the angled implant, ion-implant channeling is also reduced in the photodiode 199 with pinned surface layer 188 as compared to a conventional straight (90 degree) implant. This results in a shallow junction which is highly desirable. In addition, employing an angled implant for the formation of the pinned surface layer further ensures the creation of hookup region 193 (FIG. 6) between the p-type pinned surface layer 188 and lateral edge 153 of the field oxide region 155.

Subsequent to the formation of the pinned photodiode 199 (FIG. 6), the photoresist layer 177 is removed by conventional techniques, such as oxygen plasma for example. An insulating layer 143 (FIG. 8) may be formed over the substrate continuous in the (x, y) direction, but not necessarily continuous over the entire wafer. The insulating layer 143 may be formed, for example, of silicon dioxide, silicon nitride, silicon oxynitride, ON, NO, ONO or TEOS, among others, and to a thickness of about 100 Angstroms to about 2,500 Angstroms, more preferably of about 200 Angstroms to about 1,000 Angstroms.

Although the above embodiment has been described with reference to the formation of the insulating layer 143 subsequent to the formation of the n-type region 126 and of the pinned layer 188 of the photodiode 199, it must be understood that the present invention has equal applicability to embodiments where the insulating layer is formed subsequent to the formation of the n-type region 126 but prior to the formation of the p-type pinned layer 188.

Figure 9:
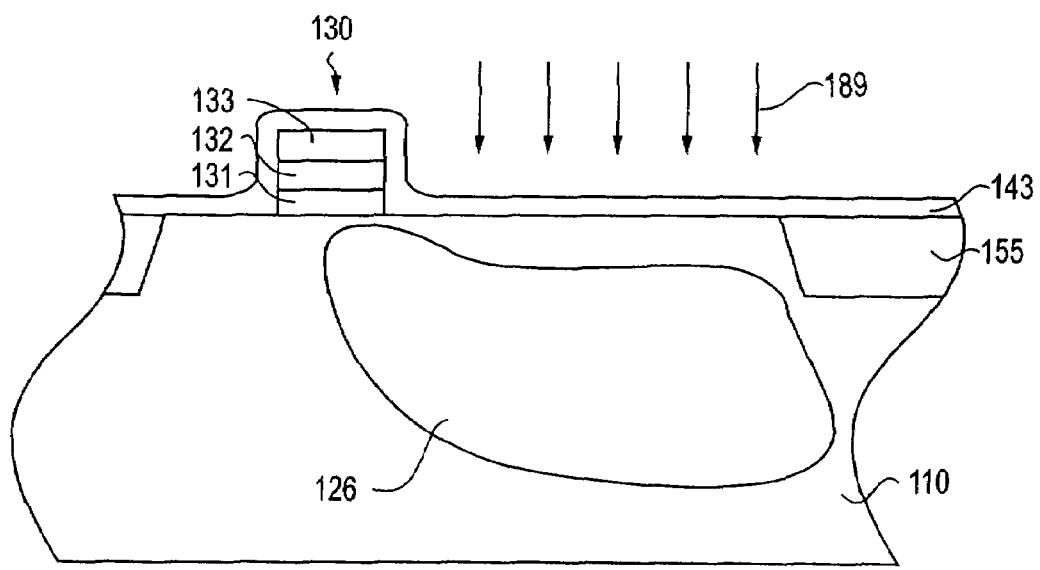
FIG. 9 illustrates the sensor pixel of FIG. 4 at a stage of processing subsequent to that shown in FIG. 4 and in accordance with a second embodiment of the present invention.
Figure 10:
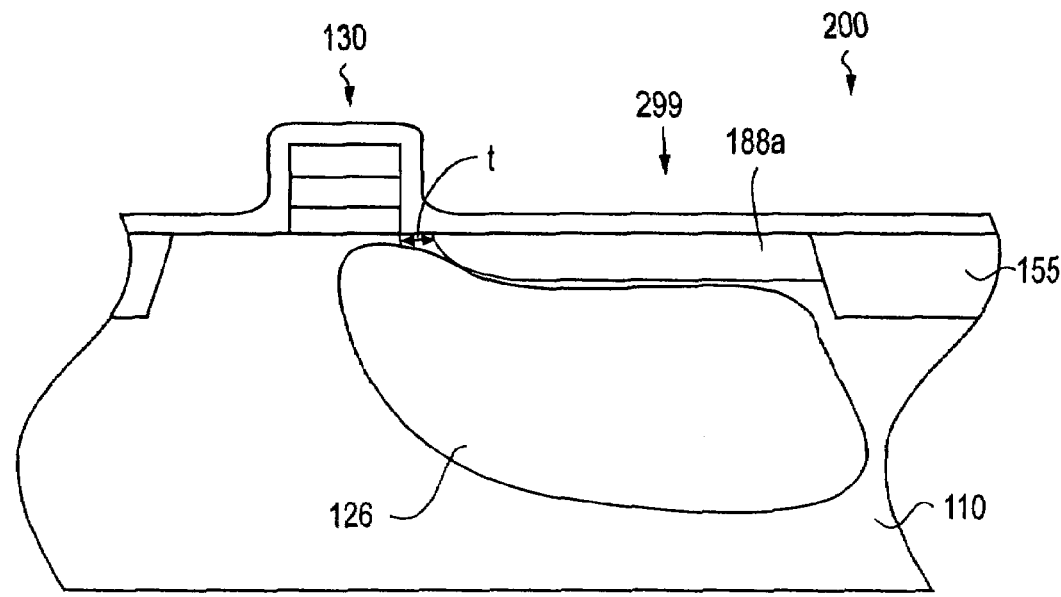
FIG. 10 is a schematic cross-sectional view of a CMOS image sensor pixel of FIG. 9 at a stage of processing subsequent to that shown in FIG. 9.

For example, FIGS. 9 and 10 illustrate a second embodiment of the present invention according to which pixel sensor cell 200 (FIG. 10) comprises photodiode 299 (FIG. 10) which is similar in part to the photodiode 199 of FIG. 8 but differs from it to the extent that p-type region 188a of photodiode 299 (FIG. 10) is formed by a straight implantation, and not by an angled implantation as in the first embodiment. Accordingly, straight surface implant 189a (FIG. 9) is conducted subsequent to the formation of the nitride or oxide spacer 143. Thus, in the second embodiment, the p-type region 188a of FIG. 10 is offset from the electrically active area 132 of the transfer gate stack 130 by an offset distance "t" which represents the thickness of the oxide or nitride spacer 143. The offset distance "t" is about 100 Angstroms to about 2,500 Angstroms, more preferably of about 200 Angstroms to about 1,000 Angstroms which, as noted above, represents the thickness of the insulating layer 143.

Figure 11:
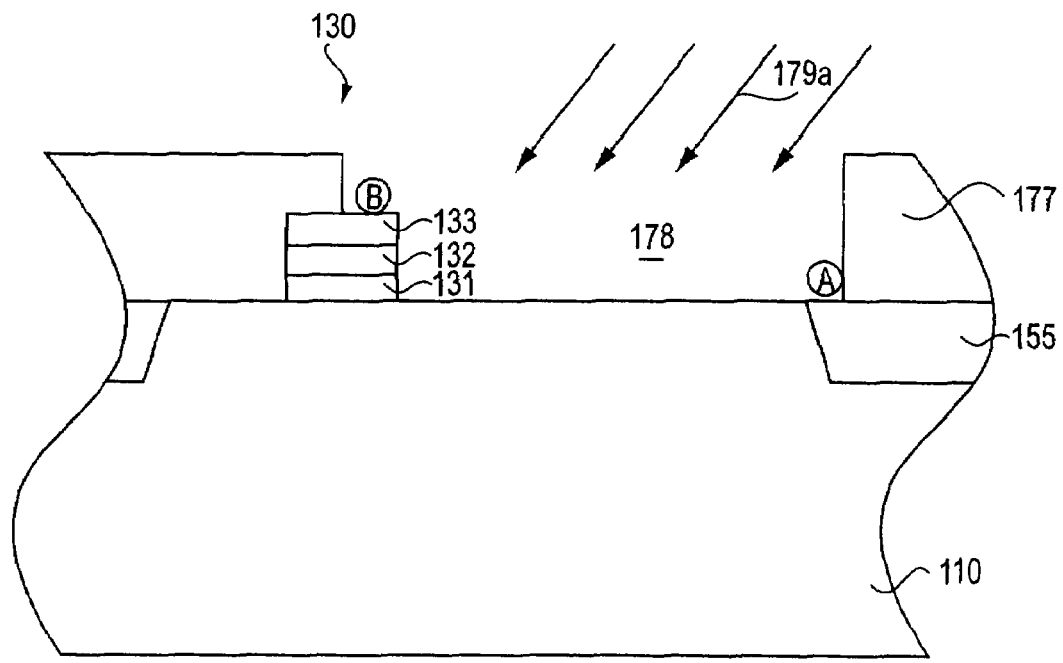
FIG. 11 illustrates the sensor pixel of FIG. 4 at a stage of processing subsequent to that shown in FIG. 4 and in accordance with a third embodiment of the present invention.
Figure 12:
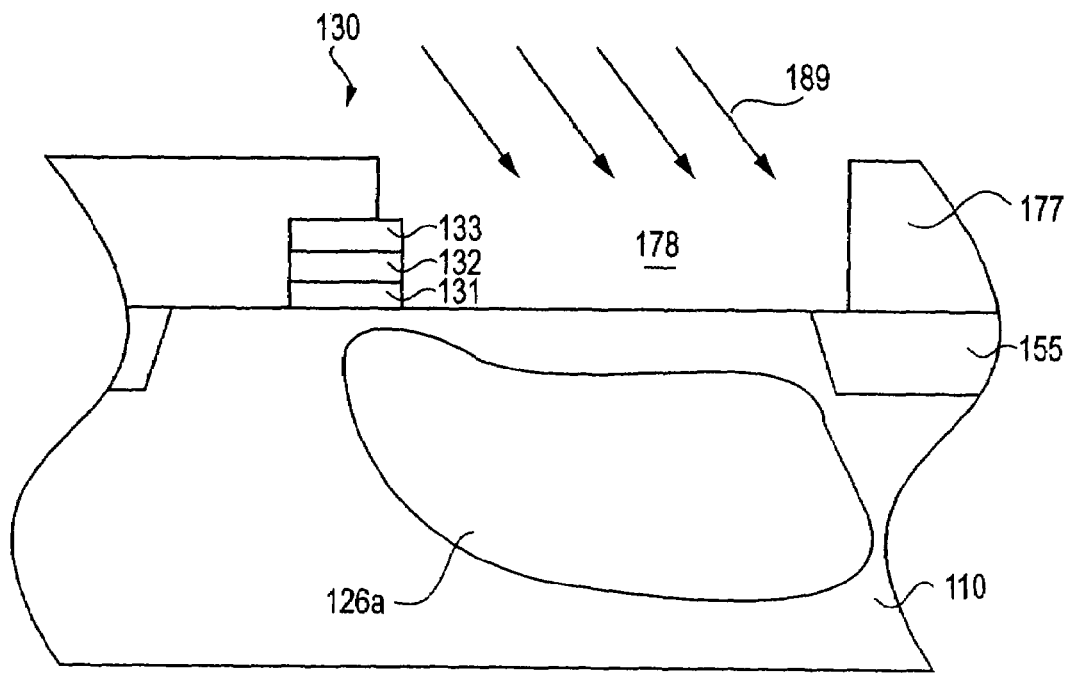
FIG. 12 is a schematic cross-sectional view of a CMOS image sensor pixel of FIG. 11 at a stage of processing subsequent to that shown in FIG. 11.
Figure 13:
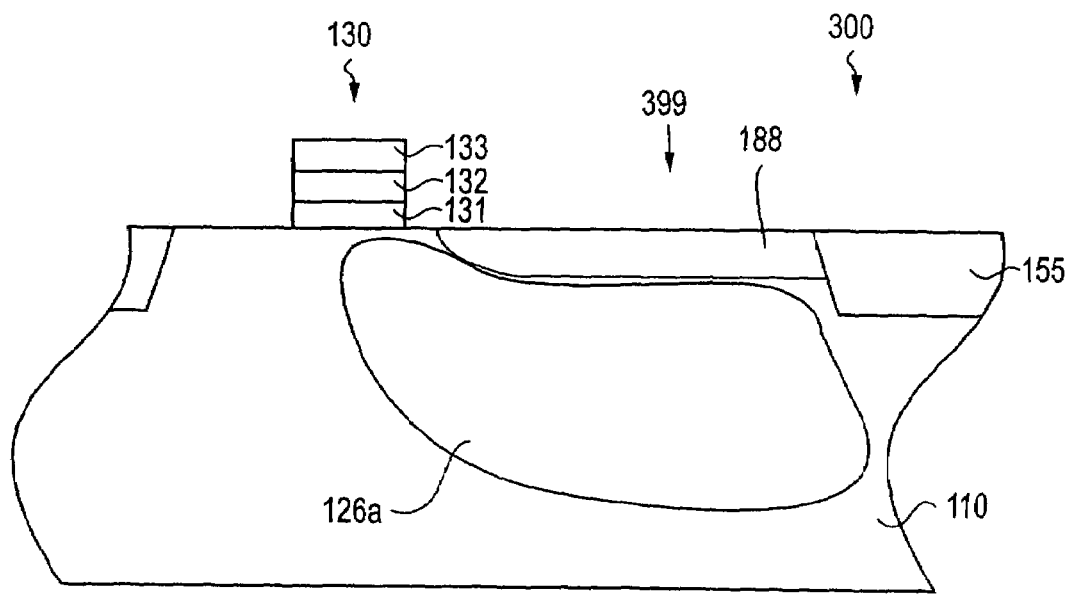
FIG. 13 is a schematic cross-sectional view of a CMOS image sensor pixel of FIG. 11 at a stage of processing subsequent to that shown in FIG. 12.

FIGS. 11-13 illustrate yet another embodiment of the present invention for fabricating pixel sensor cell 300 (FIG. 13) comprising photodiode 399 (FIG. 13) which is similar in part to the photodiode 199 of FIG. 8 but differs from it to the extent that n-type region 126a of photodiode 399 is formed by an angled implantation, and not by a straight implantation as in the first embodiment.

Referring now to FIG. 11, an angled dopant implantation 179a using a dopant of a second conductivity type, which for exemplary purposes is n-type, is conducted to implant ions through the opening 178 in a right-to-left direction and into the area of the substrate directly beneath the active area of the pixel cell and to form an n-type buried region 126a, illustrated in FIG. 12. As in the first embodiment, the implanted n-doped buried region 126a is self-aligned to the edge of the transfer gate 130 and forms a photosensitive charge storage region for collecting photogenerated electrons. The dopant concentration in the n-doped region 126a (FIG. 12) is within the range of about $1 \times 10^{16}$ to about $5 \times 10^{17}$ atoms per $cm^3$, and is preferably within the range of about $3 \times 10^{16}$ to about $1 \times 10^{17}$ atoms per $cm^3$. If desired, multiple angled implants may be also used to tailor the profile of the n-doped region 126a.

The formation of the pinned layer 188 (FIG. 13) to complete the formation of the photodiode 399 (FIG. 13) and of pixel sensor cell 300 (FIG. 13) may be conducted similarly to the formation of the pinned layer 188 or 188a of FIGS. 8 and 10, respectively.

The devices of the pixel sensor cell 100, 200, 300 including the reset transistor, the source follower transistor and row select transistor are then formed by well-known methods. Conventional processing steps may be also employed to form contacts and wiring to connect gate lines and other connections in the pixel cell 100, 200, 300. For example, the entire surface may be covered with a passivation layer of, e.g., silicon dioxide, BSG, PSG, or BPSG, which is CMP planarized and etched to provide contact holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Figure 14:
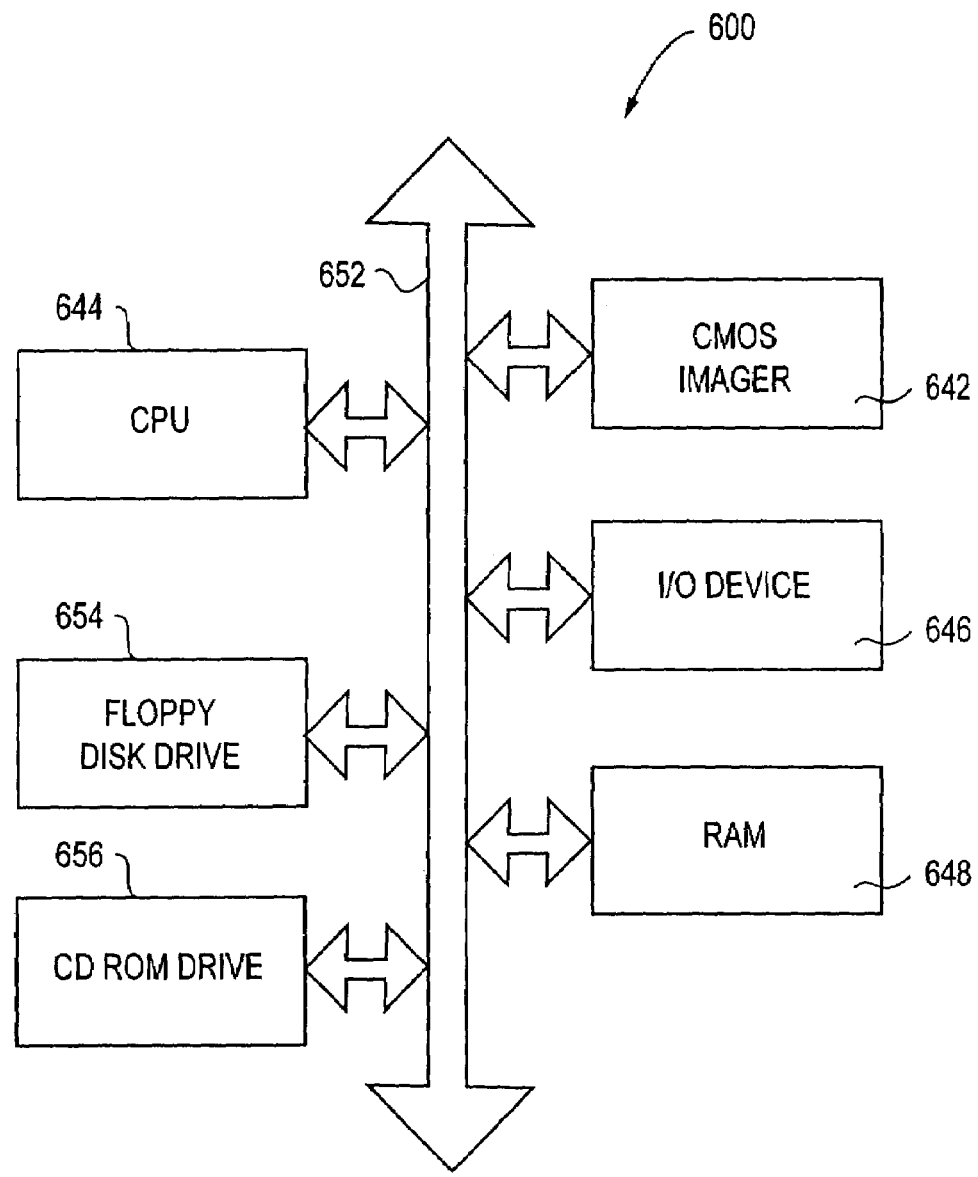
FIG. 14 illustrates a schematic diagram of a computer processor system incorporating a CMOS image sensor fabricated according to the present invention.

A typical processor based system, which includes a CMOS image sensor according to the invention is illustrated generally at 642 in FIG. 14. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the invention has been described above in connection with a four-transistor (4T) pixel cell employing a transfer transistor having a transfer gate, the invention may also be incorporated into a three-transistor (3T) cell, a five-transistor (5T) cell, a six-transistor (6T) cell or a seven-transistor (7T) cell, among others. As known in the art, a 3T cell differs from the 4T cell by the omission of the charge transfer transistor and associated gate, and the coupling of the n regions of the photodiode and the floating diffusion regions through an overlap of the two or an n region bridging the two, which is well known in the art. A 5T cell differs from the 4T cell by the addition of a shutter transistor or a CMOS photogate transistor.

In addition, although the invention has been described above with reference to the formation of p-n-p photodiodes, the invention is not limited to these embodiments. Accordingly, the invention also has applicability to photodiodes formed from n-p-n regions in a substrate. The dopant and conductivity types of all structures would change accordingly, with the transfer gate being part of a PMOS transistor, rather than an NMOS transistor as in the embodiments described above.

Further, although the invention has been described above with reference to the formation of a photodiode having a self-aligned pinned layer and part of a CMOS imager, the invention has equal applicability to the formation of a photodiode having a self-aligned pinned layer as part of a CCD imager, a global shutter transistor, a high dynamic range transistor or a storage gate, among others.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a photodiode for a pixel sensor cell, said method comprising:
    forming at least one field oxide region in a substrate;
    forming a transistor gate over said substrate and spaced apart from said at least one field oxide region;
    forming a first doped layer of a first conductivity type in said substrate;
    forming a photoresist layer over said transistor gate and said field oxide region;
    patterning said photoresist layer to form an opening extending between a location over said transistor gate and a location over said field oxide region;
    conducting a first implant through said opening to form a doped region of a second conductivity type in said first doped layer; and
    conducting an angled implant through said opening to form a second doped layer of said first conductivity type in said first doped layer, said second doped layer being located above said doped region at a surface region of said substrate.

2. The method of claim 1, wherein said second doped layer is formed in contact with said isolation region and laterally displaced from said transistor gate by about 100 to about 2,500 Angstroms.

3. The method of claim 1, wherein said second doped layer has a dopant concentration within the range of from about $1 \times 10^{17}$ to about $1 \times 10^{19}$ atoms per $cm^3$.

4. The method of claim 1, wherein said photoresist layer is formed to a thickness of about 1,000 Angstroms to about 10,000 Angstroms and wherein a height of said gate is of about 400 Angstroms to about 4,000 Angstroms.

5. The method of claim 1, wherein said angled implant is angled at about 3 degrees to about 40 degrees.

6. The method of claim 1, wherein said first conductivity type is p-type and said second conductivity type is n-type.

7. A method of forming a photodiode for a pixel sensor cell, said method comprising:
    forming at least one field oxide region in a substrate;
    forming a transistor gate over said substrate and spaced apart from said at least one field oxide region;
    forming a first doped layer of a first conductivity type in said substrate;
    conducting a first implant between said at least one field oxide region and said transistor gate by employing a mask, said first implant being angled towards said transistor gate to form a doped region of a second conductivity type in said substrate; and
    without removing the mask, conducting a second implant between said at least one field oxide region and said transistor gate, said second implant being angled towards said at least one field oxide region to form a second doped layer of said first conductivity type.

8. The method of claim 7, wherein said second doped layer is formed in contact with said isolation region and laterally displaced from said transistor gate by about 100 to about 2,500 Angstroms.

9. The method of claim 7, wherein said second doped layer has a dopant concentration within the range of from about $1 \times 10^{17}$ to about $1 \times 10^{19}$ atoms per $cm^3$.

10. The method of claim 7, wherein said second implant is angled at about 3 degrees to about 40 degrees.

11. The method of claim 7, further comprising forming a photoresist layer over said transistor gate and said field oxide region; and
    patterning said photoresist layer to form an opening extending between a location over said transistor gate and a location over said field oxide region.

12. The method of claim 11, wherein a height of said gate is of about 400 Angstroms to about 4,000 Angstroms and a thickness of said photoresist layer is of about 1,000 Angstroms to about 10,000 Angstroms.

13. The method of claim 7, wherein said first conductivity type is p-type and said second conductivity type is n-type.

14. A method of forming a photodiode for a pixel sensor cell, said method comprising:
    forming at least one field oxide region in a substrate;
    forming a transistor gate over said substrate and spaced apart from said at least one field oxide region;
    forming a first doped layer of a first conductivity type in said substrate;
    conducting a first implant between said transistor gate and said at least one field oxide region to form a doped region of a second conductivity type in said first doped layer; and
    conducting a second implant at an angle between said at least one field oxide region and said transistor gate to form a second doped layer of said first conductivity type, wherein said angle of said second implant determines a lateral distance of said second doped layer from said transistor gate, wherein said lateral distance is a function of said angle of said second implant and a height of said transistor gate.

15. The method of claim 14, wherein said angle of said second implant is about 3 degrees to about 40 degrees, and wherein said lateral distance of said second doped layer from said transistor gate is about 100 to about 2,500 Angstroms.

16. The method of claim 14, wherein conducting said second implant comprises conducting multiple implants at various angles to determine a profile of said second doped layer.

17. The method of claim 14, further comprising forming a photoresist layer over said transistor gate and said field oxide region; and patterning said photoresist layer to form an opening extending between a location over said transistor gate and a location over said field oxide region.

18. The method of claim 17, wherein said lateral distance of said second doped layer from said transistor gate is further a function of a thickness of said photoresist layer.

19. The method of claim 18, wherein said height of said transistor gate is of about 400 Angstroms to about 4,000 Angstroms and said thickness of said photoresist layer is of about 1,000 Angstroms to about 10,000 Angstroms.

20. The method of claim 14, wherein said first conductivity type is p-type and said second conductivity type is n-type.

* * * * *